(12) United States Patent
Sakurai et al.

(10) Patent No.: US 8,039,858 B2
(45) Date of Patent: Oct. 18, 2011

(54) FLUORESCER SOLUTION, LIGHT-EMITTING DEVICE, AND METHOD FOR MANUFACTURING SAME

(75) Inventors: Naoaki Sakurai, Kanagawa-ken (JP); Junsei Yamabe, Kanagawa-ken (JP); Hiroshi Koizumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 57 days.

(21) Appl. No.: 12/611,481

(22) Filed: Nov. 3, 2009

(65) Prior Publication Data

US 2010/0109037 A1    May 6, 2010

(30) Foreign Application Priority Data

Nov. 5, 2008   (JP) .................................. 2008-284679

(51) Int. Cl.
    *H01L 33/00*   (2010.01)
(52) U.S. Cl. ................ 257/98; 257/81; 257/89; 257/99; 257/100; 257/101; 257/103; 257/E21.502; 257/E25.02; 257/E33.059; 257/E33.061
(58) Field of Classification Search ................ 257/81, 257/89, 98, 99, 100, 101, 103, E21.502, E25.02, 257/E33.059, E33.061; 313/503
    See application file for complete search history.

(56) References Cited

U.S. PATENT DOCUMENTS

| | | | |
|---|---|---|---|
| 2007/0215892 A1* | 9/2007 | Ishii et al. | 257/98 |
| 2010/0301738 A1* | 12/2010 | Hosokawa et al. | 313/503 |

FOREIGN PATENT DOCUMENTS

| | | |
|---|---|---|
| JP | 2004-161806 | 6/2004 |
| JP | 2007-335495 | 12/2007 |
| WO | WO 02/059982 A1 | 8/2002 |

OTHER PUBLICATIONS

Office Action issued Feb. 17, 2011 in Japan Application No. 2008-284679 (With English Translation).
Office Action issued May 30, 2011, in Korean Patent Application No. 10-2009-0103509 (with English-language translation).

* cited by examiner

*Primary Examiner* — Dao H Nguyen
(74) *Attorney, Agent, or Firm* — Oblon, Spivak, Mclelland, Maier & Neustadt, L.L.P.

(57) ABSTRACT

In a fluorescer solution, a plurality of types of fluorescent particles are contained in a resin liquid. Average particle sizes of these fluorescent particles decrease as densities of the types increase. In other words, average settling rates $v_s$ of the types of the fluorescent particles ascertained by $$v_s = \frac{D_p^2 \times (\rho_p - \rho_f) \times g}{18 \times \eta}$$

are equal to each other, where $D_p$ is an average particle size of each of the types of fluorescent particles, $\rho_p$ is a density of each of the types of fluorescent particles, $\rho_f$ is a density of the resin liquid, $\eta$ is a viscosity of the resin liquid, g is the acceleration due to gravity, and $v_s$ is an average settling rate of each of the types of fluorescent particles.

7 Claims, 5 Drawing Sheets

US 8,039,858 B2

FLUORESCER SOLUTION, LIGHT-EMITTING DEVICE, AND METHOD FOR MANUFACTURING SAME

CROSS-REFERENCE TO RELATED APPLICATIONS

This application is based upon and claims the benefit of priority from the prior Japanese Patent Application No. 2008-284679, filed on Nov. 5, 2008; the entire contents of which are incorporated herein by reference.

BACKGROUND OF THE INVENTION

1. Field of the Invention

The invention relates to a fluorescer solution including multiple types of fluorescent particles, a light-emitting device, and a method for manufacturing the same.

2. Background Art

A light-emitting device emitting light of a prescribed color generally includes an LED (Light-Emitting Diode) chip emitting light having a first wavelength and a fluorescent particle that absorbs the light and emits light having a second wavelength longer than the first wavelength. Thereby, the light having the second wavelength emitted by the fluorescent particle is emitted to the outside of the light-emitting device (for example, refer to international publication WO 2002/059982 (FIG. 1)). Also, the light having the first wavelength emitted by the LED chip may be emitted after being mixed with the light having the second wavelength emitted by the fluorescent particle.

Such a light-emitting device is manufactured by the following methods. Namely, a package having a recess formed on the upper face thereof is constructed, and an LED chip is mounted on the bottom face of the recess. Then, a fluorescer solution in which fluorescent particles are dispersed in a resin liquid is poured into the recess from a dispenser. Then, heat treatment is performed to thermoset the fluorescer solution and thereby form a resin member. Thereby, a light-emitting device is manufactured in which the resin member including the fluorescent particles is provided in the recess of the package.

In recent years, technology has been developed to provide multiple types of fluorescent particles in one light-emitting device to emit light having mutually different wavelengths. Thereby, more versatile control of the color of the emitted light is possible. In the case where such a light-emitting device is manufactured, multiple types of fluorescent particles are contained in the fluorescer solution described above.

However, in a light-emitting device in which the multiple types of fluorescent particles described above are provided, the color of the emitted light undesirably fluctuates with the timing of the manufacturing.

SUMMARY OF THE INVENTION

According to an aspect of the invention, there is provided a fluorescer solution, including: a resin liquid; and a plurality of types of fluorescent particles contained in the resin liquid, average particle sizes of the types of fluorescent particles decreasing as densities of the types increase.

According to another aspect of the invention, there is provided a light-emitting device, including: a package including a recess formed in an upper face; a chip mounted on a bottom face of the recess to emit light having a first wavelength; a resin member filled into the recess; and a plurality of types of fluorescent particles contained in the resin member to emit light having mutually different wavelengths longer than the first wavelength when light having the first wavelength is incident on the plurality of types of fluorescent particles, average particle sizes of the types of fluorescent particles decreasing as densities of the types increase.

According to still another aspect of the invention, there is provided a method for manufacturing a light-emitting device, including: mounting a chip on a bottom face of a recess formed in an upper face of a package, the chip emitting light having a first wavelength; pouring a fluorescer solution into the recess, the fluorescer solution including a resin liquid containing a plurality of types of fluorescent particles emitting light having mutually different wavelengths longer than the first wavelength when light having the first wavelength is incident on the plurality of types of the fluorescent particles; and curing the fluorescer solution, average particle sizes of the types of fluorescent particles decreasing as densities of the types increase.

BRIEF DESCRIPTION OF THE DRAWINGS

FIG. 1A illustrates the state directly after pouring into a dispenser, and FIG. 1B illustrates the state after some time has passed from the pouring into the dispenser;

FIG. 2A illustrates a comparative example, and FIG. 2B illustrates the first embodiment;

DETAILED DESCRIPTION OF THE INVENTION

Embodiments of the invention will now be described with reference to the drawings.

A first embodiment will now be described.

This embodiment is an embodiment of a fluorescer solution.

Figure 1A:
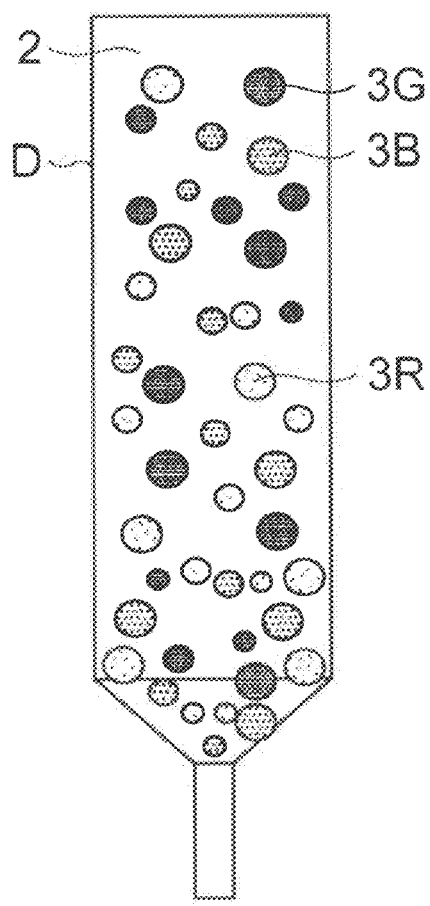
FIGS. 1A and 1B are schematic views illustrating a fluorescer solution according to a first embodiment of the invention, where
Figure 1B:
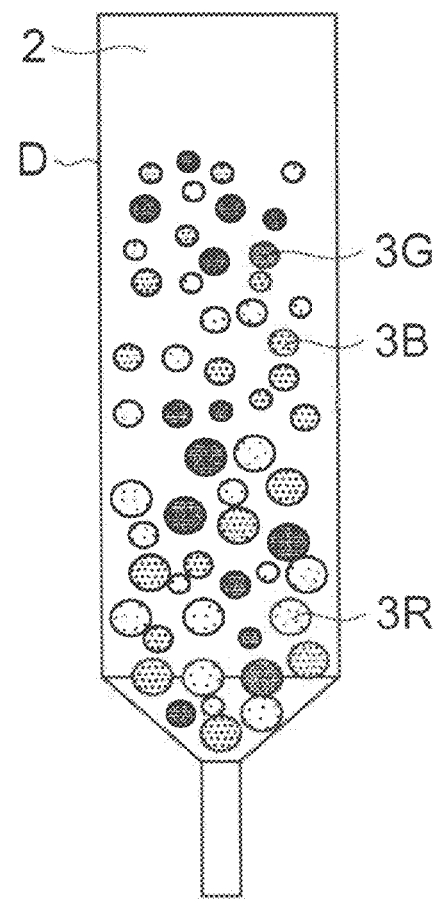

FIGS. 1A and 1B are schematic views illustrating a fluorescer solution according to this embodiment. FIG. 1A illustrates the state directly after pouring into a dispenser. FIG. 1B illustrates the state after some time has passed from the pouring into the dispenser.

As illustrated in FIG. 1A, a fluorescer solution 1 according to this embodiment is used by being sealed in a dispenser D. The dispenser D repeatedly dispenses a prescribed amount of the fluorescer solution 1 from a dispensing aperture provided on the lower end portion while holding the fluorescer solution 1. A resin liquid 2 is provided in the fluorescer solution 1. The resin liquid 2 is a liquid including a resin material, e.g., a liquid including silicone. The resin liquid 2 contains, for example, three types of fluorescent particles 3R, 3G, and 3B. The fluorescent particle 3R is a particle made of a fluorescent material that is excited to emit red light when ultraviolet rays are incident thereon. The fluorescent particle 3G is a particle made of a fluorescent material that is excited to emit green light when ultraviolet rays are incident thereon. The fluorescent particle 3B is a particle made of a fluorescent material that is excited to emit blue light when ultraviolet rays are incident thereon. Hereinbelow, the fluorescent particles 3R, 3G, and 3B also are generally referred to as fluorescent particles 3.

The average particle sizes of the types of the fluorescent particles 3 decrease as the densities of the types of the fluorescent particles 3 increase. For example, it is taken that the particle density of the fluorescent particle 3R is the highest, that of the fluorescent particle 3B is next highest, and that of the fluorescent particle 3G is the lowest. In such a case, the average particle size of the fluorescent particle 3R is the smallest, that of the fluorescent particle 3B is next smallest, and that of the fluorescent particle 3G is the largest.

For example, the relationship of the average particle sizes $D_p$ among the fluorescent particles 3R, 3G, and 3B is adjusted to make average settling rates $v_s$ ascertained by Formula 1 recited below substantially equal to each other, where Dp (m) is the average particle size of each of the types of the fluorescent particles 3, $p_p$ (kg/m$^3$) is the density of each of the types of the fluorescent particles 3, $p_f$ (kg/m$^3$) is the density of the resin liquid 2, η(Pa·s) is the viscosity of the resin liquid 2, g (m/s$^2$) is the acceleration due to gravity, and $v_s$ (m/s) is the average settling rate of each of the types of the fluorescent particles 3. Formula 1 recited below is Stoke's formula.

$$v_s = \frac{D_p^2 \times (\rho_p - \rho_f) \times g}{18 \times \eta} \quad \text{Formula 1}$$

Operational effects of this embodiment will now be described.

As illustrated in FIG. 1A, the fluorescent particles 3 are uniformly dispersed in the resin liquid 2 directly after the fluorescer solution 1 is poured into the dispenser D. However, as illustrated in FIG. 1B, the fluorescent particles 3 settle in the resin liquid 2 after a certain amount of time has passed. This phenomenon cannot be avoided even by providing a mixing apparatus or the like in the dispenser D. Because the settling rates of the fluorescent particles 3 depend on the particle sizes and the densities as illustrated in Formula 1 recited above, generally, the average settling rates of the fluorescent particles 3R, 3G, and 3B are mutually different. Accordingly, the ratio of the contained amounts of the fluorescent particles 3R, 3G, and 3B included in the fluorescer solution 1 dispensed from the lower end portion of the dispenser D undesirably fluctuates according to the time passed after pouring the fluorescer solution 1 into the dispenser D. As a result, the color of the light emitted by a light-emitting device manufactured using the fluorescer solution 1 as a material undesirably fluctuates with the timing of the manufacturing.

Therefore, as described above in this embodiment, the average particle sizes of the types of the fluorescent particles 3 decrease as the densities of the types of the fluorescent particles 3 increase. Thereby, the effect of the settling rate being faster as the particle density increases is cancelled by the effect of the settling rate being slower as the particle size decreases, and the settling rates of the fluorescent particles 3R, 3G, and 3B can be mutually matched. In particular, by adjusting the average particle size of each of the fluorescent particles to make the settling rates equal to each other according to Formula 1 recited above, the average settling rates of the fluorescent particles 3R, 3G, and 3B can be substantially equal to each other. As a result, the ratio of the contained amounts of the fluorescent particles 3R, 3G, and 3B included in the fluorescer solution 1 dispensed from the lower end portion of the dispenser D is substantially constant regardless of the dispensing timing. Thereby, the color reproducibility of the light emitted by the light-emitting device manufactured using the fluorescer solution 1 is high.

Effects of this embodiment will now be described by presenting specific test results.

The tests described below include the test results of this embodiment, test results of a comparative example, and a comparison of the two. The density $p_p$ and the average particle size $D_p$ are illustrated in Table 1 for the fluorescent particles 3R, 3G, and 3B for this embodiment and the comparative example. The values of the density $p_f$ and the viscosity η of the resin liquid and the acceleration g due to gravity are illustrated in Table 2. Table 1 also illustrates the settling rates $v_s$ calculated by Formula 1 recited above using the values illustrated in Table 1 and Table 2. In the specification, the median diameter (the 50% diameter) is used as the average particle size of the particles. A particle size analyzer was used to measure the average particle size of each of the fluorescent particles. A SALD 2200 made by Shimadzu Corporation, for example, was used as the particle size analyzer.

TABLE 1

| | Embodiment | | | Comparative example | | |
| --- | --- | --- | --- | --- | --- | --- |
| Fluorescent particle | Particle density $\rho_p$ (kg/m$^3$) | Average particle size $D_p$ (m) | Settling rate $v_s$ (m/s) | Particle density $\rho_p$ (kg/m$^3$) | Average particle size $D_p$ (m) | Settling rate $v_s$ (m/s) |
| 3R | 5.7 × 10$^3$ | 6.9 × 10$^{-6}$ | 2.1 × 10$^{-8}$ | 5.7 × 10$^3$ | 9.2 × 10$^{-6}$ | 3.7 × 10$^{-8}$ |
| 3G | 3.8 × 10$^3$ | 8.9 × 10$^{-6}$ | 2.0 × 10$^{-8}$ | 3.8 × 10$^3$ | 8.9 × 10$^{-6}$ | 2.0 × 10$^{-8}$ |
| 3B | 4.5 × 10$^3$ | 7.8 × 10$^{-6}$ | 1.9 × 10$^{-8}$ | 4.5 × 10$^3$ | 6.0 × 10$^{-6}$ | 1.2 × 10$^{-8}$ |

TABLE 2

| | |
| --- | --- |
| Resin liquid density $\rho_f$ (kg/m$^3$) | 1.1 × 10$^3$ |
| Resin liquid viscosity η (Pa·s) | 5.8 |
| Acceleration g due to gravity (m/s$^2$) | 9.8 |

As illustrated in Table 1, the settling rates differ greatly by type of fluorescent particle in the comparative example because the relationship among the densities and the average particle sizes of the types of fluorescent particles is not the relationship described above. For example, the settling rate of the fluorescent particle 3R is more than three times the settling rate of the fluorescent particle 3B.

Conversely, in this embodiment, the relationship described above is satisfied by adjusting the average particle size of each of the fluorescent particles. The density of each of the fluorescent particles is determined necessarily by the type of fluorescent particle and therefore is not adjusted.

Specifically, the average particle size of the fluorescent particle 3G was fixed at the same value as that of the comparative example; and the average settling rate of the fluorescent particle 3G was calculated based on Formula 1 recited above. Then, the average particle sizes of the fluorescent particles 3R and 3B were adjusted to make the average settling rates of the fluorescent particles 3R and 3B equal to the average settling rate of the fluorescent particle 3G. Methods of adjusting the average particle sizes of the fluorescent particles include, for example, classifying the fluorescent particles by passing the fluorescent particles through a sieve. Then, the fluorescent particles 3R, 3G, and 3B having adjusted average particle sizes were added to the resin liquid 2, and the fluorescer solution 1 was made. In other words, in this test, the fluorescer solution 1 was made by adjusting the average particle sizes of the fluorescent particles 3R and 3B based on the density and the average particle size of the fluorescent particle 3G and the densities of the fluorescent particles 3R and 3B. Classifying of the fluorescent particles was not performed in the comparative example.

Then, the settling rates of the fluorescent particles of the fluorescer solution 1 made as described above were measured.

Figure 2A:
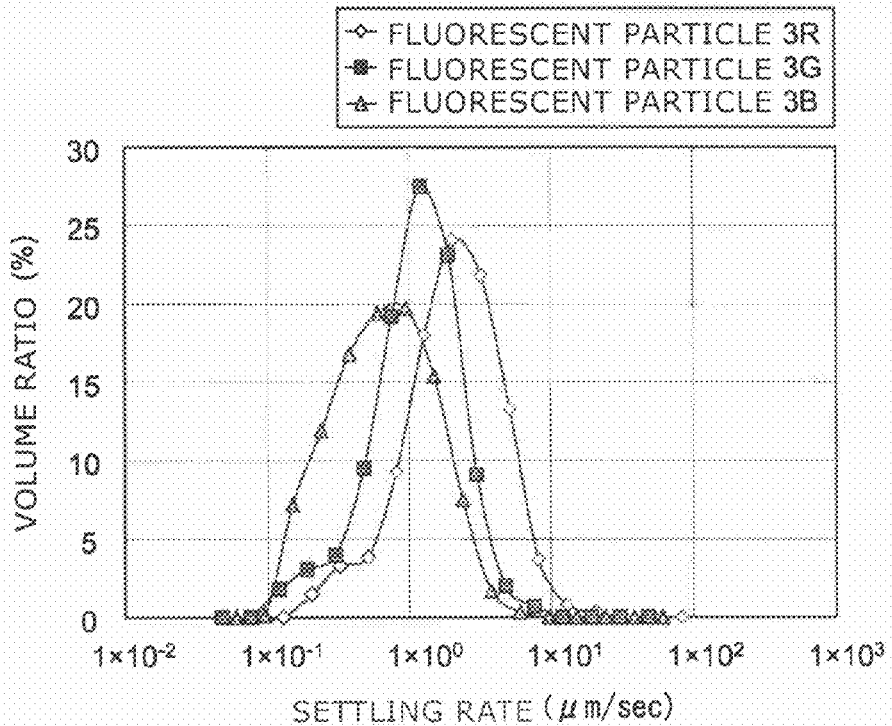
FIGS. 2A and 2B are graphs illustrating the settling rate distributions by type of fluorescent particle in which the settling rate is plotted on the horizontal axis and the volume ratio is plotted on the vertical axis, and where
Figure 2B:
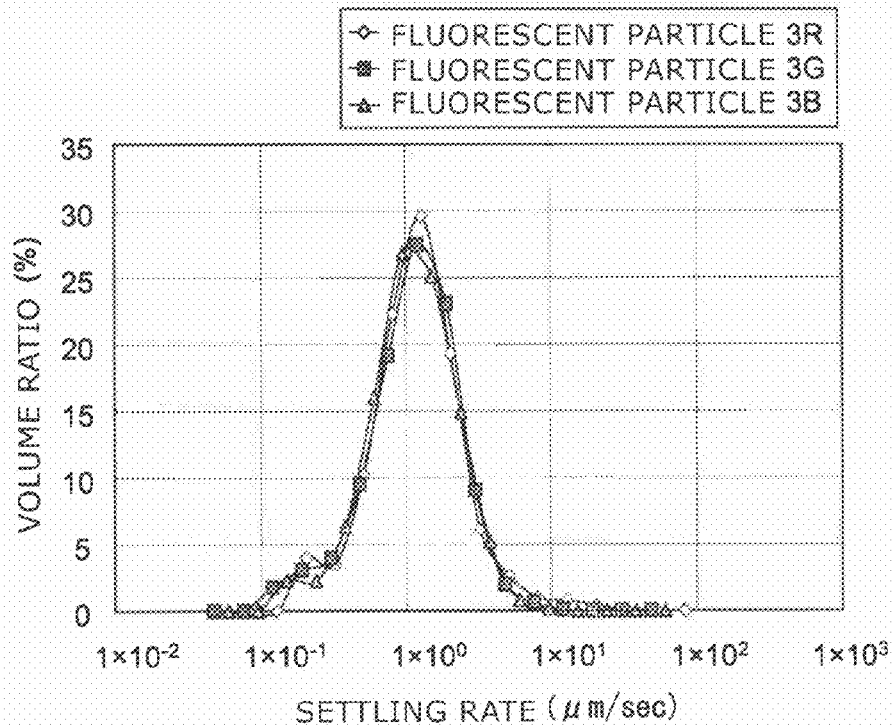

FIGS. 2A and 2B are graphs illustrating the settling rate distributions by type of fluorescent particle. The settling rate is plotted on the horizontal axis, and the volume ratio is plotted on the vertical axis. FIG. 2A illustrates the comparative example, and FIG. 2B illustrates this embodiment.

In the comparative example illustrated in FIG. 2A, the settling rate distributions of the fluorescent particles 3R, 3G, and 3B are clearly mutually different. In particular, the fluorescent particle 3R includes particles with extremely high settling rates. Conversely, in this embodiment illustrated in FIG. 2B, both the modes and the distribution states of the settling rates of the fluorescent particles 3R, 3G, and 3B substantially match each other.

Moreover, in the comparative example described above, the viscosity of the fluorescer solution 1 increases and the amount of the fluorescer solution 1 dispensed from the dispenser D undesirably decreases in the case where the concentration of the fluorescent particles 3 in the fluorescer solution 1 increases. Conversely, in this embodiment, each of the fluorescent particles is classified; and therefore, there are no particles with markedly large particle sizes; and accordingly, there are no particles with exceedingly high settling rates. Therefore, the viscosity of the fluorescer solution 1 positioned at the lowermost portion of the dispenser D does not markedly increase, and fluctuations of the dispensed amount of the fluorescer solution 1 can be suppressed.

Such effects also were confirmed by tests. Using the fluorescer solutions according to this embodiment and the comparative example described above, the fluctuation of the dispensed amount of the fluorescer solution dispensed from the dispenser was evaluated. Specifically, one dispensed amount was set to 3 mg (milligrams); dispensing was performed 20,000 times; and the fluctuation amount was measured. As a result, the dispensed amount of the comparative example was 3±0.3 mg. Conversely, the dispensed amount of this embodiment was 3±0.1 mg and was more stable than that of the comparative example.

Further, light-emitting devices were constructed by dispensing the fluorescer solution 1 described above onto LED chips and curing. The manufacturing method and configuration of the light-emitting device are described in detail in the second and third embodiments described below. A UV-LED chip emitting ultraviolet rays with wavelengths of 380 to 460 nm was used as the LED chip. The UV-LED chip was caused to emit ultraviolet rays; the fluorescent particles were excited; and the fluctuation of the chromaticity of the light emitted by the light-emitting devices was measured. In other words, 20,000 light-emitting devices were constructed by the 20,000 dispenses described above; a chromaticity Cx of the light emitted thereby was measured; and a difference ДCx between the maximum value and the minimum value was ascertained. As a result, while the difference ДCx of the comparative example was 0.04, the difference ДCx of this embodiment was 0.02, and the fluctuation of the chromaticity was drastically suppressed.

A second embodiment of the invention will now be described.

This embodiment is an embodiment of a method for manufacturing a light-emitting device using the fluorescer solution according to the first embodiment described above.

FIGS. 3A to 3C and FIGS. 4A to 4C are cross-sectional views of processes, illustrating a method for manufacturing the light-emitting device according to this embodiment. Solder layers are illustrated as being thicker than actual components in FIGS. 3A to 4C for convenience of description.

Figure 3A:
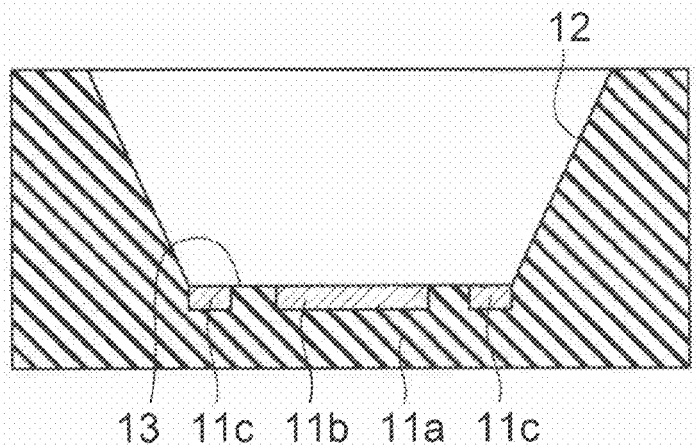
FIGS. 3A to 3C are cross-sectional views of processes, illustrating a method for manufacturing the light-emitting device according to a second embodiment of the invention.

First, as illustrated in FIG. 3A, a package 11 is constructed. A recess 12 is formed in the upper face of the package 11. The configuration of the recess 12 is, for example, a mortar configuration; and the side faces are inclined to open upward. The package 11 has a configuration including a package main unit 11a made of an insulative material, e.g., a white ceramic or a white resin, a negative electrode 11b buried in the package main unit 11a, and a positive electrode 11c buried in the package main unit 11a. The negative electrode 11b and the positive electrode 11c are exposed at a bottom face 13 of the recess 12.

Figure 3B:
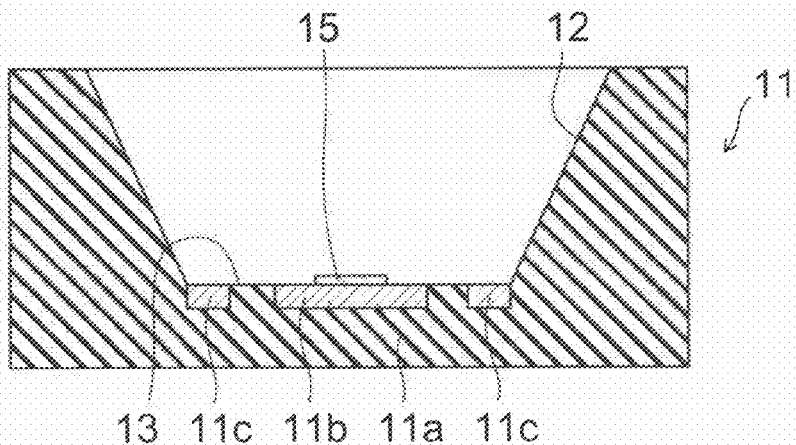

Then, as illustrated in FIG. 3B, a solder layer 15 is formed in the central portion of the bottom face 13 of the recess 12. The solder layer 15 is connected to the negative electrode 11b.

Figure 3C:
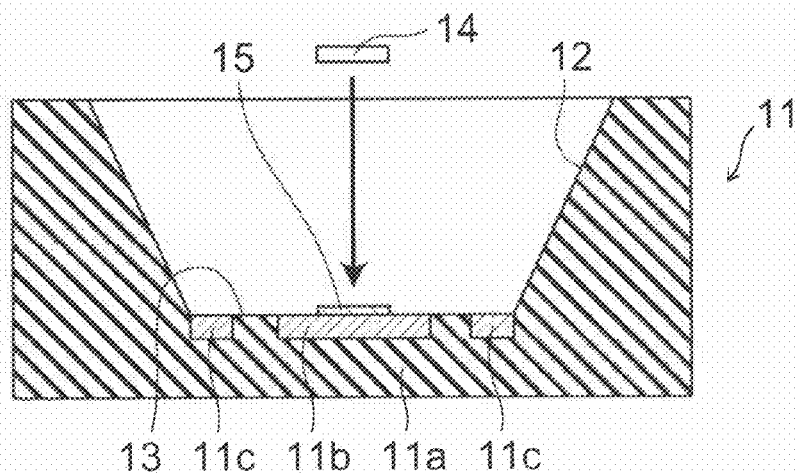

Then, as illustrated in FIG. 3C, an LED chip 14 is bonded to the solder layer 15. Thereby, the lower face of the LED chip 14 is connected to the negative electrode 11b via the solder layer 15, and the LED chip 14 is mounted on the bottom face 13. The LED chip 14 is, for example, a chip emitting ultraviolet rays.

Figure 4A:
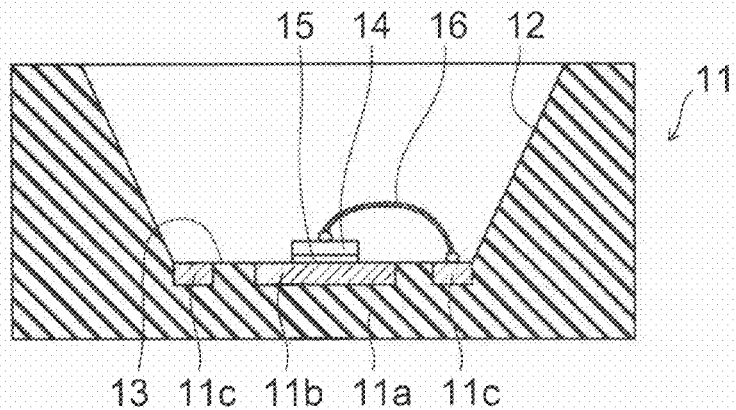
FIGS. 4A to 4C are cross-sectional views of processes, illustrating the method for manufacturing the light-emitting device according to the second embodiment.

Then, as illustrated in FIG. 4A, bonding is performed between the upper face of the LED chip 14 and the positive electrode 11c using a wire 16. Thereby, the upper face of the LED chip 14 is connected to the positive electrode 11c via the wire 16.

On the other hand, the fluorescer solution 1 (referring to FIG. 1) is made by the method described in the first embodiment described above. The fluorescer solution 1 includes the resin liquid 2 containing the fluorescent particles 3R, 3G, and 3B. The relationship among the densities and the average particle sizes of the fluorescent particles 3R, 3G, and 3B is as described in the first embodiment. The fluorescer solution 1 is supplied to the dispenser D.

Figure 4B:
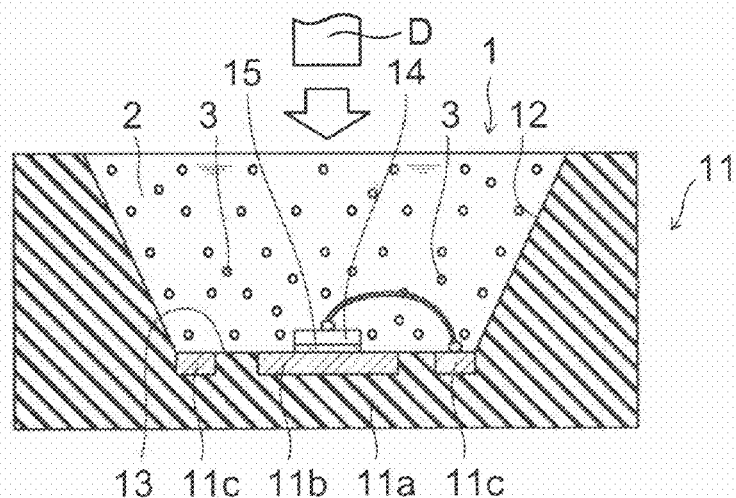

Then, as illustrated in FIG. 4B, the fluorescer solution 1 is poured into the recess 12 from the dispenser D by dispensing a prescribed amount of the fluorescer solution 1 from the lower end portion of the dispenser D. At this stage, the resin liquid 2 of the fluorescer solution 1 is a liquid, and the fluorescent particles 3 are dispersed uniformly in the resin liquid 2.

Figure 4C:
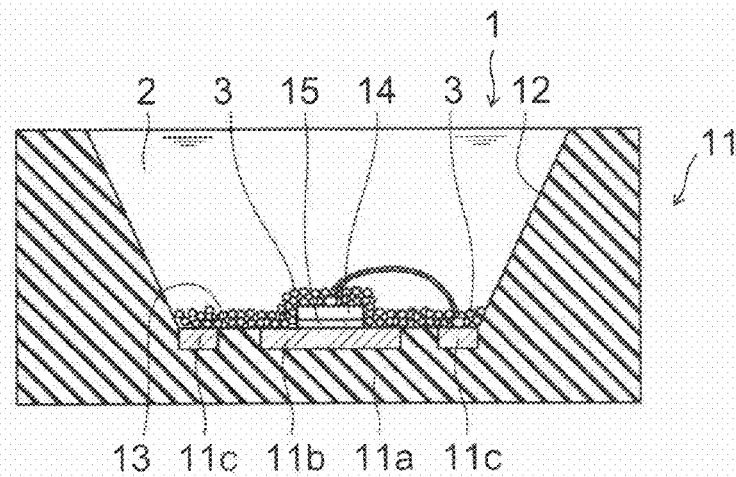

Then, by leaving the configuration for a certain period of time, the fluorescent particles 3 settle in the resin liquid 2 poured into the recess 12 as illustrated in FIG. 4C.

Continuing, the package 11 is heated. For example, the package 11 is heated in an oven at a temperature of 150° C. for one hour. Thereby, the resin liquid 2 is thermoset, and the resin liquid 2 forms a resin member. As a result, the light-emitting device is manufactured.

Operational effects of this embodiment will now be described.

In this embodiment, the average settling rates of the fluorescent particles 3R, 3G, and 3B are substantially equal to each other in the dispenser D because the fluorescer solution according to the first embodiment described above is used as the fluorescer solution. Therefore, the ratio of the contained amounts of the fluorescent particles 3R, 3G, and 3B in the fluorescer solution 1 do not fluctuate with the timing of the dispensing from the dispenser D, and the ratio of the amounts of the fluorescent particles 3R, 3G, and 3B poured into the recess 12 of the package 11 can be constant.

A third embodiment of the invention will now be described.

This embodiment is an embodiment of the light-emitting device manufactured by the manufacturing method according to the second embodiment described above.

Figure 5:
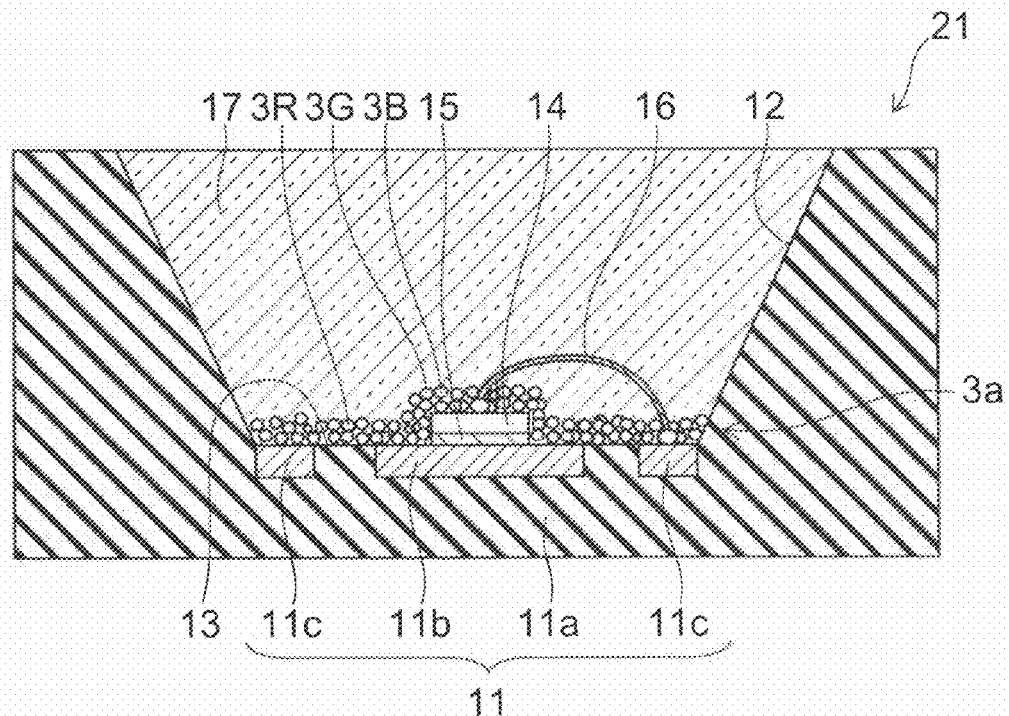
FIG. 5 is a cross-sectional view illustrating a light-emitting device according to a third embodiment of the invention.

FIG. 5 is a cross-sectional view illustrating the light-emitting device according to this embodiment.

As illustrated in FIG. 5, the package 11 is provided in an LED device 21, and the recess 12 is formed in the upper face of the package 11. As described above, the configuration of the recess 12 is, for example, a mortar configuration. The package 11 has a configuration including the package main unit 11a made of an insulative material, e.g., a white ceramic or a white resin, the negative electrode 11b buried in the package main unit 11a, and the positive electrode 11c buried in the package main unit 11a. The negative electrode 11b and the positive electrode 11c are exposed at the bottom face 13 of the recess 12.

The LED chip 14 is provided in the recess 12. The LED chip 14 is, for example, a light-emitting element emitting ultraviolet rays. The configuration thereof is a rectangular configuration. The LED chip 14 is mounted on the central portion of the bottom face 13 of the recess 12. The lower face of the LED chip 14 is connected to the negative electrode 11b via the solder layer 15. The upper face of the LED chip 14 is connected to the positive electrode 11c via the wire 16. Thereby, the LED chip 14 is connected between the negative electrode 11b and the positive electrode 11c.

A resin member 17 made of a transparent resin is filled into the recess 12. The resin member 17 is formed of, for example, a silicon resin. The depth of the recess 12 is greater than the thickness of the LED chip 14, and the LED chip 14 and the wire 16 are buried in the resin member 17. Many of the fluorescent particles 3R, 3G, and 3B are mixed into the resin member 17 and deposited in a layer configuration in a lower portion of the resin member 17, i.e., in a portion contacting the bottom face 13 and the upper face and the side faces of the LED chip 14. Thereby, the LED chip 14 is covered with a deposit layer 3a made of the fluorescent particles 3R, 3G, and 3B. As described above in the first embodiment, the fluorescent particles 3R, 3G, and 3B emit red, green, and blue light, respectively, when ultraviolet rays are incident thereon. The resin member 17 transmits the ultraviolet rays emitted by the LED chip 14 and the red, green, and blue light emitted by the fluorescent particles 3R, 3G, and 3B.

In the light-emitting device 21 according to this embodiment, the average particle sizes of the types of the fluorescent particles 3R, 3G, and 3B decrease as the densities of the types of the fluorescent particles 3R, 3G, and 3B increase as described above in the first embodiment. For example, the particle density of the fluorescent particle 3R is the highest, that of the fluorescent particle 3B is next highest, and that of the fluorescent particle 3G is the lowest. In such a case, the average particle size of the fluorescent particle 3R is the smallest, that of the fluorescent particle 3B is next smallest, and that of the fluorescent particle 3G is the largest. For example, $D_p$ (m) is the average particle size of each of the types of the fluorescent particles 3, and $p_p$ (kg/m$^3$) is the density of each of the types of the fluorescent particles 3. Although the resin liquid 2 of the fluorescer solution 1 (referring to FIG. 1) of the resin member 17 containing the multiple types of the fluorescent particles 3R, 3G, and 3B is cured, $p_p$ (kg/m$^3$) is the density of the resin liquid 2 prior to the curing, and n (Pa·s) is the viscosity of the resin liquid 2. Also, g (m/s$^2$) is the acceleration due to gravity, and $v_s$ (m/s) is the average settling rate of each of the types of the fluorescent particles 3R, 3G, and 3B. In such a case, the relationship of the average particle sizes $D_p$ among the fluorescent particles 3R, 3G, and 3B is adjusted to make the average settling rates $v_s$ ascertained by Formula 1 recited above (Stoke's formula) substantially equal to each other.

In such an LED device 21, the LED chip 14 emits ultraviolet rays in all directions when the negative electrode 11b and the positive electrode 11c supply power to the LED chip 14. Although the light emitted downward is blocked by the package 11, the light emitted upward and sideward enters the resin member 17. The ultraviolet rays entering the resin member 17 are incident on and absorbed by the fluorescent particles 3R, 3G, and 3B. Thereby, the fluorescent materials forming the fluorescent particles 3R, 3G, and 3B are excited to emit light having a longer wavelength than that of the incident light, e.g., red, green, and blue light, respectively. Such light is emitted to the outside of the recess 12 from an opening of the recess 12 directly from the resin member 17 or after being reflected by the side face of the recess 12; and thereby, such light is emitted to the outside of the light-emitting device 21. At this time, the light emitted from the light-emitting device 21 is white because the red, green, and blue light emitted by the fluorescent particles 3R, 3G, and 3B, respectively, mixes.

Because the relationship among the densities and the average particle sizes of the types of fluorescent particles in this embodiment is the relationship described above, the ratio of the amounts of the types of the fluorescent particles 3R, 3G, and 3B contained in the fluorescer solution supplied from the dispenser in the method for manufacturing the LED device 21 does not depend on the timing of the manufacturing and is substantially constant. Therefore, the ratio of the intensities of the red light, the green light, and the blue light emitted by the light-emitting device 21 is substantially constant, and the color reproducibility of the emitted light is high.

A variation of this embodiment will now be described.

Figure 6:
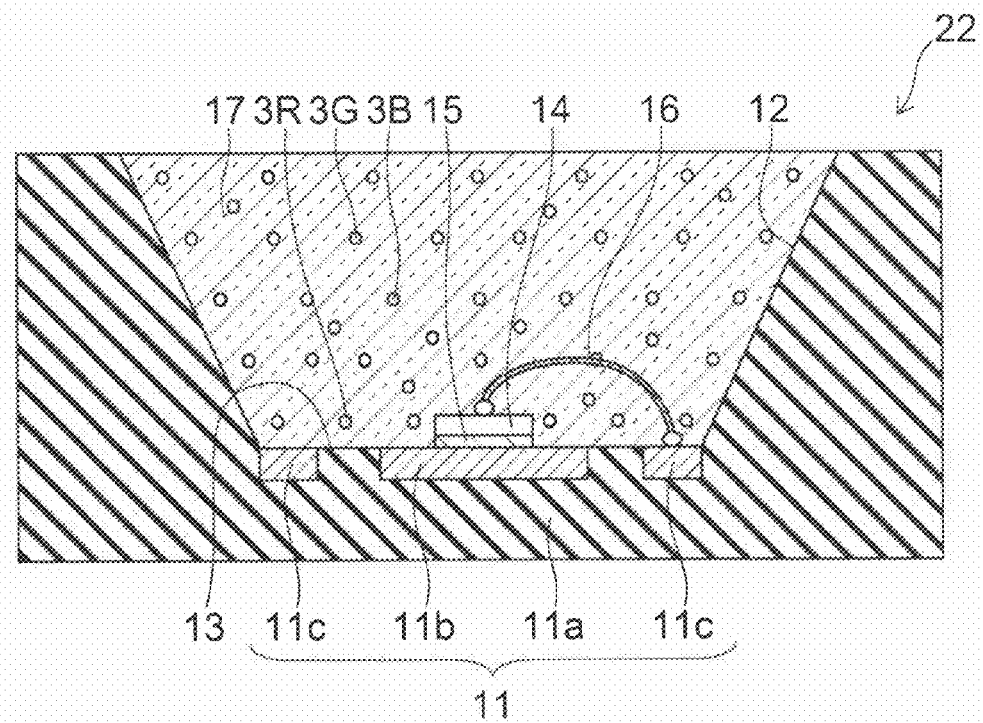
FIG. 6 is a cross-sectional view illustrating a light-emitting device according to a variation of the third embodiment.

FIG. 6 is a cross-sectional view illustrating a light-emitting device according to this variation.

As illustrated in FIG. 5, in the light-emitting device 21 according to the third embodiment described above, the fluorescent particles 3R, 3G, and 3B are deposited in the lower portion of the resin member 17 to form the deposit layer 3a. Conversely, in a light-emitting device 22 according to this variation illustrated in FIG. 6, the fluorescent particles 3R, 3G, and 3B are dispersed substantially uniformly over the entire resin member 17. Otherwise, the configuration of the light-emitting device 22 is similar to that of the light-emitting device 21. In other words, the average particle sizes of the types of the fluorescent particles 3R, 3G, and 3B decrease as the densities of the types increase; and, for example, Formula 1 recited above is satisfied. Such a particle-dispersed light-emitting device 22 can be manufactured by omitting the process of settling the fluorescent particles illustrated in FIG. 4C from the second embodiment described above. In other words, the manufacturing is possible by curing the fluorescer solution prior to the fluorescent particles settling in the resin liquid. The operational effects of this variation are similar to those of the third embodiment described above. Namely, the color reproducibility of the emitted light is high also for the light-emitting device 22.

Hereinabove, the invention is described with reference to exemplary embodiments. However, the invention is not limited to these embodiments. Additions, deletions, or design modifications of components or additions, omissions, or condition modifications of processes appropriately made by one skilled in the art in regard to the embodiments described above are within the scope of the invention to the extent that the purport of the invention is included.

For example, although an example is illustrated in the embodiments described above where the densities and the average particle sizes of the fluorescent particles 3R, 3G, and 3B are adjusted to values to make the average settling rates calculated by Formula 1 recited above equal to each other, the invention is not limited thereto. It is sufficient that the average particle sizes of the types of the fluorescent particles 3R, 3G, and 3B decrease as the densities of the types increase.

Also, although an example is illustrated in the embodiments described above where three types of fluorescent particles are used, the invention is not limited thereto. Two, four, or more types of the fluorescent particles may be used.

Moreover, although an example is illustrated in the first embodiment described above where the average particle sizes of the fluorescent particles are adjusted by using a sieve to classify the fluorescent particles, the method for adjusting the average particle sizes of the fluorescent particles is not limited thereto. For example, a fluorescent particle may be specially manufactured to have any average particle size.

Further, although an example is illustrated in the second embodiment described above where the average settling rate of the fluorescent particle 3G having the intermediate settling rate of the fluorescent particles 3R, 3G, and 3B prior to the classifying is used as a reference to adjust the average particle sizes of the other fluorescent particles 3R and 3B and match the average settling rates of the fluorescent particles 3R and 3B to the average settling rate of the fluorescent particle 3G, the invention is not limited thereto.

For example, as in the third embodiment described above, in the case where the fluorescent particles 3 settle in the resin liquid 2 after the fluorescer solution 1 is poured into the recess 12 of the package 11, the productivity of the light-emitting device 21 is improved when the fluorescent particles 3 rapidly settle. In such a case, the average settling rate of the fluorescent particle 3R having the fastest settling rate of the fluorescent particles 3R, 3G, and 3B prior to classifying may be used as the reference, and the average particle sizes of the other fluorescent particles 3G and 3B may be adjusted.

On the other hand, as in the variation of the third embodiment described above, in the case where the fluorescent particles 3 are dispersed substantially uniformly over the entire resin member 17, it is favorable that the settling rates of the fluorescent particles 3 are slow. In such a case, the average settling rate of the fluorescent particle 3B having the slowest settling rate of the fluorescent particles 3R, 3G, and 3B prior to classifying may be used as the reference, and the average particle sizes of the other fluorescent particles 3R and 3G may be adjusted.

Further, the settling rates may be matched to any set settling rate to adjust the particle sizes of the fluorescent particles 3R, 3G, and 3B without using any of the settling rates of the fluorescent particles 3R, 3G, and 3B prior to classifying as a reference. In addition to the average particle sizes of the fluorescent particles 3, the densities of the fluorescent particles 3 also may be adjusted.

Also, although an example is illustrated in the third embodiment described above where white light is emitted by the light-emitting device, the invention is not limited thereto. The color of the emitted light may be any color. For example, the invention also includes a light-emitting device emitting light as an entirety of a third red color by a mixture of light of a first red color and light of a second red color slightly different from the first red color by containing a first type of fluorescent particle emitting light of the first red color and a second type of fluorescent particle emitting light of the second red color. In such a light-emitting device, the color of the emitted light is not constrained by the color of the light emitted by the fluorescent particles, and any color is possible.

Moreover, although an example is illustrated in the third embodiment described above where the chip is an LED chip emitting ultraviolet rays, the invention is not limited thereto. For example, an LED chip emitting visible light may be used, and a light-emitting chip other than an LED chip may be used. In the case where a light-emitting chip emitting visible light is used, the light emitted by the light-emitting chip also may be emitted by the light-emitting device and mixed with the light emitted by the fluorescent particles.

Further, although an example is illustrated in the third embodiment described above where the recess is formed in the upper face of the package, the upper face of the package may be flat, and the LED chip may be mounted on the flat upper face. In other words, a package may be used having a substrate configuration and no large recess on the upper face thereof to store the entire LED chip. In such a case, the resin member may be formed to bulge upward on the upper face of the package to be formed in, for example, a hemispherical configuration. The resin member having the hemispherical configuration may provide a lens effect to concentrate the emitted light.

The invention claimed is:

1. A light-emitting device, comprising:
a package having a recess present in an upper face;
a chip mounted on a bottom face of the recess to emit light having a first wavelength; and
a resin member present in the recess;
wherein
the resin member comprises first fluorescent particles, second fluorescent particles, and third fluorescent particles that emit light having mutually different wavelengths longer than the first wavelength when light having the first wavelength is incident on the first, second, and third fluorescent particles,
substantially all of the first, second, and third fluorescent particles are present on the bottom face of the recess in the form of a layer that covers the chip,
an average particle size of the first fluorescent particles is smaller than an average particle size of the second fluorescent particles and the average particle size of the second fluorescent particles is smaller than an average particle size of the third fluorescent particles, and
a density of the first fluorescent particles is higher than a density of the second fluorescent particles and the density of the second fluorescent particles is higher than a density of the third fluorescent particles.

2. The device according to claim 1, wherein:
the resin member is a cured resin liquid comprising the first, second, and third fluorescent particles; and average settling rates $v_s$ of the first, second and third fluorescent particles as ascertained by $$v_s = \frac{D_p^2 \times (\rho_p - \rho_f) \times g}{18 \times \eta}$$

are equal to each other, where $D_p$ is an average particle size of each of the types of fluorescent particles, $\rho_p$ is a density of each of the types of fluorescent particles, $\rho_f$ is a density of the resin liquid, $\eta$ is a viscosity of the resin liquid, g is the acceleration due to gravity, and $v_s$ is an average settling rate of each of the types of fluorescent particles.

3. The device according to claim 1, wherein:
the resin member is a cured resin liquid comprising the first, second, and third fluorescent particles; and
average settling rates $v_s$ of the first, second and third fluorescent particles as ascertained by $$v_s = \frac{D_p^2 \times (\rho_p - \rho_f) \times g}{18 \times \eta}$$

are substantially equal to each other, where $D_p$ is an average particle size of each of the types of fluorescent particles, $\rho_p$ is a density of each of the types of fluorescent particles, $\rho_f$ is a density of the resin liquid, $\eta$ is a viscosity of the resin liquid, g is the acceleration due to gravity, and $v_s$ is an average settling rate of each of the types of fluorescent particles.

4. The device according to claim 1, wherein substantially all of the first, second, and third fluorescent particles are present on the bottom face of the recess in the form of a layer that covers the chip and the resin is cured.

5. The device according to claim 1, wherein
the light having the first wavelength is ultraviolet rays,
the first fluorescent particles comprise fluorescent particles emitting red light when the ultraviolet rays are incident thereon,
the second fluorescent particles comprise fluorescent particles emitting blue light when the ultraviolet rays are incident thereon, and
the third fluorescent particles comprise fluorescent particles emitting green light when the ultraviolet rays are incident thereon.

6. The device according to claim 1, wherein the resin comprises a silicone resin.

7. The device according to claim 1, wherein
the first fluorescent particles comprise particles having a density of $5.7 \times 10^3$ kg/m$^3$ and an average particle size of $6.9 \times 10^{-6}$ m;
the second fluorescent particles comprise particles having a density of $4.5 \times 10^3$ kg/m$^3$ and an average particle size of $7.8 \times 10^{-6}$ m; and
the third fluorescent particles comprise particles having a density of $3.8 \times 10^3$ kg/m$^3$ and an average particle size of $8.9 \times 10^{-6}$ m.

* * * * *